(12) United States Patent
Guibert et al.

(10) Patent No.: US 8,577,172 B2
(45) Date of Patent: Nov. 5, 2013

(54) RECONFIGURABLE MODULE AND METHOD OF IMPLEMENTING THIS RECONFIGURABLE MODULE FOR PERFORMING MORPHOLOGICAL OPERATIONS

(75) Inventors: Mickael Guibert, Le Perreux (FR); Renaud Schmit, Auneau (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 259 days.

(21) Appl. No.: 13/062,282

(22) PCT Filed: Aug. 18, 2009

(86) PCT No.: PCT/EP2009/060659
§ 371 (c)(1),
(2), (4) Date: Mar. 9, 2011

(87) PCT Pub. No.: WO2010/026042
PCT Pub. Date: Mar. 11, 2010

(65) Prior Publication Data
US 2011/0164830 A1    Jul. 7, 2011

(30) Foreign Application Priority Data
Sep. 5, 2008 (FR) ...................... 08 04890

(51) Int. Cl.
*G06K 9/36* (2006.01)
(52) U.S. Cl.
USPC ............................ 382/276; 382/133; 708/625

(58) Field of Classification Search
None
See application file for complete search history.

(56) References Cited

U.S. PATENT DOCUMENTS

| 3,976,827 | A | * | 8/1976 | Alien et al. | ................... | 382/133 |
| 4,860,240 | A | * | 8/1989 | Hartley et al. | ................ | 708/625 |
| 2005/0195420 | A1 | | 9/2005 | Gerrits | | |
| 2008/0013862 | A1 | | 1/2008 | Isaka et al. | | |

FOREIGN PATENT DOCUMENTS

JP    2006261919 A    9/2006

* cited by examiner

*Primary Examiner* — Tsung-Yin Tsai
(74) *Attorney, Agent, or Firm* — Baker & Hostetler LLP

(57) ABSTRACT

The invention provides a reconfigurable module allowing morphological operations to be carried out for image processing. The module includes an operational block having five inputs, three outputs, three adders/subtracters and four logic blocks. The logic blocks provide various routings between the three adders/subtracters to enable the outputs to deliver the result of basic operations carried out on the five inputs. The reconfigurable module has a reduced number of components while at the same time allowing various morphological operations to be performed whose parameters can be modified. Furthermore, the reconfigurable module is serially combined to carry out more complex morphological operations. The invention also provides a method for implementing the reconfigurable module allowing an integral image, an eroded image, an expanded image, a distance image or projections along the rows and columns of the original image to be determined starting from an original image.

17 Claims, 9 Drawing Sheets

Original image

Integral image

Integral image

Original image

Intermediate image

Integral image

RECONFIGURABLE MODULE AND METHOD OF IMPLEMENTING THIS RECONFIGURABLE MODULE FOR PERFORMING MORPHOLOGICAL OPERATIONS

CROSS-REFERENCE TO RELATED APPLICATIONS

This application is a National Stage of International patent application PCT/EP2009/060659, filed on Aug. 18, 2009, which claims priority to foreign French patent application No. FR 08 04890, filed on Sep. 5, 2008, the disclosures of which are incorporated by reference in their entirety.

FIELD OF THE INVENTION

The invention relates to a reconfigurable module and a method of implementing this reconfigurable module for performing morphological operations. In particular, it provides a single reconfigurable module that allows a set of morphological operations applied to image processing to be carried out. Starting from an original image, the reconfigurable module notably allows an integral image, an eroded image, an expanded image, a Manhattan distance image and projections of the original image to be determined. The invention is notably applicable to the fields of onboard electronics such as video for mobile telephony or computer-aided driving systems.

BACKGROUND OF THE INVENTION

Morphological operations form the basic operations for image processing. For this reason, they are much used in image processing. With the development of multimedia technologies, in particular the enhancement of the image resolutions associated with the miniaturization of electronic circuits, there is now a growing need for optimization of these morphological operations. Today, application specific integrated circuits, or "ASICs", allow morphological operations to be accelerated. However, an ASIC circuit, on its own, only allows one particular morphological operation to be accelerated. In other words, no ASIC module exists that is actually capable of accelerating several morphological operations. Furthermore, as far as the erosion and expansion operations are concerned, a particular ASIC circuit is only able to perform these operations for a structural element of predefined dimensions, or, at the very least, for structural elements with dimensions smaller than the predefined dimensions. In other words, an ASIC circuit performing an erosion or expansion operation for a structural element of dimensions 3×3 cannot carry out this erosion or expansion operation for a structural element of dimensions 5×5. One solution to these two limitations thus consists in using a programmable processing structure such as a personal computer. However, such a structure exhibits a performance that is greatly inferior to that of ASIC circuits. By way of example, at least three cycles per pixel are required in order to obtain a result with a programmable structure, whereas a result can be obtained for several pixels in a single cycle with certain ASIC circuits.

SUMMARY OF THE INVENTION

One aim of the invention is notably to overcome all or a part of the aforementioned drawbacks by providing a reconfigurable module allowing several morphological operations to be performed with the best compromise with respect to performance-flexibility-silicon surface area. For this purpose, one subject of the invention is a reconfigurable module comprising an operational block with five inputs and three outputs. The first output of the operational block is capable of delivering either the result of the addition of the first and second inputs of the operational block, or the result of the subtraction of the second input from the first input of the operational block, or the minimum of the first and second inputs of the operational block, or the maximum of the first and second inputs of the operational block. The second output of the operational block is capable of delivering either the result of the addition of the fourth and fifth inputs of the operational block, or the result of the subtraction of the fifth input from the fourth input of the operational block, or the minimum of the fourth and fifth inputs of the operational block, or the maximum of the fourth and fifth inputs of the operational block, or the minimum of the first, second and fourth inputs of the operational block, or the maximum of the first, second and fourth inputs of the operational block. The third output of the operational block is capable of delivering either the result of the addition of the first output and the third input of the operational block, or the result of the subtraction of the third input from the first output of the operational block.

The invention notably has the advantage of allowing the operations for integration, erosion, expansion, Manhattan distance and projection to be carried out with a single module and in an optimized manner. The erosion and expansion operations can furthermore be carried out with structural elements of dimensions greater than 3×3 by serially combining the reconfigurable modules.

Another subject of the invention is a method for implementing the reconfigurable module described hereinabove. According to the invention, the method comprises a step consisting in determining, starting from an original image comprising M rows and N columns of pixels p(m,n), M and N being positive integers, either an integral image, an eroded image, an expanded image, a Manhattan distance image, or a projection along the rows and a projection along the columns of the original image. The type of final image can be determined depending on the type of operations carried out by adders/subtracters belonging to the operational block and links established between inputs and outputs of logic blocks belonging to the operational block. The integral image, the eroded image, the expanded image and the Manhattan distance image have the same dimensions as the original image.

BRIEF DESCRIPTION OF THE DRAWINGS

The invention will be better understood and other advantages will become apparent upon reading the detailed description of an embodiment presented by way of example, which description is presented with reference to appended drawings which show:

FIG. 1a, an example of an original image;

FIG. 1b, an integral image associated with the original image in FIG. 1a;

FIG. 2, an illustration of the principle for calculation of the weights of a set of pixels using an integral image;

FIG. 3a, a second example of an original image;

FIG. 3b, an intermediate image obtained by a first step of the integral image operation according to the invention starting from the original image in FIG. 3a;

FIG. 3c, an integral image obtained by a second step of the integral image operation according to the invention starting from the intermediate image in FIG. 3b;

FIG. 4, an illustration of the principle of determination of an eroded image and of an expanded image starting from a third example of an original image;

FIG. 6b, an illustration of the principle of determination of an eroded image obtained by a second step of the erosion operation according to the invention starting from the intermediate image in FIG. 6a;

DETAILED DESCRIPTION

Description of the Morphological Operations

In the following part of the description, matrix images will be employed, in other words images composed of pixels laid out in rows and columns. From a geometrical point of view, the pixels are equivalent to rectangles of similar size. A pixel p(m,n) is located with reference to a point of origin O using its position in a row m and in a column n, m and n being integers in the range between 1 and, respectively, the number M of rows and the number N of columns in the image. Furthermore, rectangular images are considered, in other words images comprising the same number of pixels p(m,n) for each row.

Integration

Figures 1A, 1B, 2, 3A:
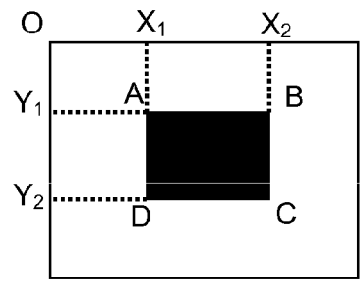

FIGS. 1a and 1b illustrate the principle of a first morphological operation, referred to as integration. FIG. 1a shows an image, referred to as original image, composed of four rows (M=4) and four columns (N=4) of pixels p(m,n), i.e. sixteen pixels p(m,n). A scalar value known as weighting wo(m,n) is associated with each pixel p(m,n) of the original image. For an image coded over eight bits, the weighting wo(m,n) can thus be in the range between the values 0 and 255. The integral image operation consists in determining an image referred to as integral image, of same size as the original image, for which the weighting wi(m,n) of each pixel p(m,n) is determined from the sum of the weighting wo(m,n) of all the pixels p(x,y) situated in the rectangular area bounded by the origin O and the pixel p(m,n) in question. The integral image operation may be modeled by the equation:

$$\forall (m, n) \in [1, M] \times [1, N], \quad (1)$$

$$wi(m, n) = \sum_{x=1}^{m} \sum_{y=1}^{n} wo(x, y)$$

The integral image thus obtained is shown in FIG. 1b.

Using the integral image, it is possible to accelerate the calculation of the sum of the weightings wo(m,n) of any particular group of pixels p(m,n). Such a group of pixels p(m,n) is referred to as a surface. FIG. 2 illustrates the principle for calculating the weighting of a rectangle ABCD. In an obvious manner, the weighting W of the surface ABCD may be obtained, using the integral image, by an addition and two subtractions according to the following equation:

$$W = A - B + C - D \quad (2)$$

The use of the integral image avoids having to add up all the weightings wo(m,n) of the pixels p(m,n) belonging to the surface ABCD. This is particularly advantageous where several surfaces have to be calculated for the same image and where the resolution of the image is high.

Figures 3B, 3C, 4:
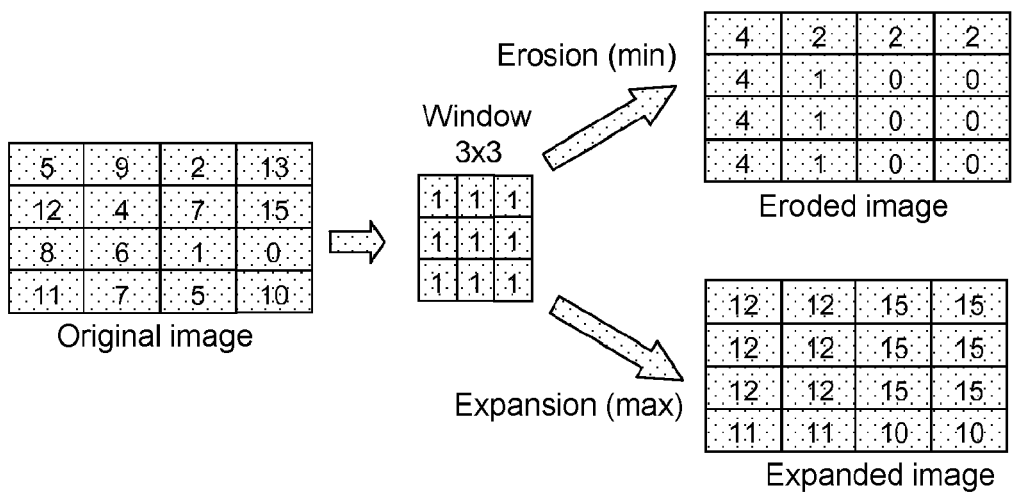

According to the invention, the integral image is determined in two steps, a first step determining an intermediate image starting from the original image and a second step determining the integral image starting from the intermediate image. The intermediate image has, like the integral image, the same size as the original image. An example of an original image is shown in FIG. 3a. The weightings wii(m,n) of the pixels p(m,n) for the intermediate image are determined from one to the next by adding to the weighting wo(m,n) of the pixel p(m,n) in question in the original image the weighting wii(m−1,n) of the pixel p(m−1,n) in the intermediate image situated in the same column on the preceding row. The result for the intermediate image is illustrated in FIG. 3b. The weightings wi(m,n) of the pixels p(m,n) for the integral image are then determined, again from one to the next, by adding to the weighting wii(m,n) of the pixel p(m,n) in question in the intermediate image the weighting wi(m,n−1) of the pixel p(m,n−1) in the integral image situated on the same row in the preceding column. The result of the integral image is illustrated in FIG. 3c. The determination of the weightings wii(m,n) for the intermediate image and of the weightings wi(m,n) for the integral image may be modeled by the following algorithm:

```
FOR m varying from 1 to M, DO:
    FOR n varying from 1 to N, DO:
        wii(m, n) = wo(m, n)+ wii(m − 1, n)      (3)
    End FOR
End FOR
FOR m varying from 1 to M, DO:
    FOR n varying from 1 to N, DO:
        wi(m, n) = wii(m, n)+ wi(m, n − 1)       (4)
    End FOR
End FOR
```

The particular cases of the first row (m=1) and of the first column (n=1) can easily be handled by considering a row and a column referred to as initialization row and column. The initialization row (m=0) can be inserted before the first row (m=1) in the intermediate image. The weightings wii(0,n) of all the pixels p(0,n) of this initialization row are set to the value zero, in such a manner that the weightings wii(1,n) of the pixels p(1,n) of the first row (m=1) of the intermediate image are equal to the weightings wo(1,n) of the same pixels p(1,n) in the original image. Furthermore, the initialization column (n=0) can be inserted before the first column (n=1) of the integral image. The weighting wi(m,0) of all the pixels p(m,0) in this initialization column are set to the value zero, in such a manner that the weightings wi(m,1) of the pixels p(m,1) of the first column (n=1) of the integral image are equal to the weightings wii(m,1) of the same pixels p(m,1) in the intermediate image. According to another embodiment, the particular case of the first row (m=1) is handled by initializing the weighting wii(1,n) of the pixels p(1,n) of the first row (m=1) of the intermediate image to the same values as the weighting wo(1,n) of the pixels p(1,n) of the first row (m=1) of the original image, and the particular case of the first column (n=1) is handled by initializing the weighting wi(m, 1) of the pixels p(m,1) of the first column (n=1) of the integral image to the same values as the weighting wii(m,1) of the pixels p(m,1) of the first column (n=1) of the intermediate image. The equations 3 and 4 of the preceding algorithm are then determined for m varying from 2 to M and for n varying from 2 to N.

The preceding description is presented by considering that the intermediate image is obtained by adding row by row the weightings wo(m,n) and wii(m−1,n) of the pixels p(m,n) and p(m−1,n) of the original image and of the intermediate image and that the integral image is obtained by adding column by column the weightings wii(m,n) and wi(m,n−1) of the pixels p(m,n) and p(m,n−1) of the intermediate image and of the integral image. It goes without saying that the additions row by row may be inverted with the additions column by column by considering the appropriate initialization row and column. The algorithm then becomes:

```
FOR n varying from 1 to N, DO:
    FOR m varying from 1 to M, DO:
        wii(m, n) = wo(m, n)+ wii(m, n − 1)         (3')
    End FOR
End FOR
FOR n varying from 1 to N, DO:
    FOR m varying from 1 to M, DO:
        wi(m, n) = wii(m, n)+ wi(m − 1, n)          (4')
    End FOR
End FOR
```

Erosion—Expansion

FIG. 4 illustrates the principle of two other morphological operations, referred to as erosion and expansion. These two morphological operations are carried out in a similar manner. In the case of a black and white monochrome image, the erosion operation is notably used to eliminate the gray-level peaks and to "widen the holes", whereas the expansion operation is used to widen the gray-level peaks and to "fill in the holes". These operations make use of a working window, also referred to as structural element, composed of a mesh of pixels. This mesh may be square, rectangular or hexagonal. FIG. 4 shows an example of an original image composed of four rows (M=4) and four columns (N=4) of pixels p(m,n) together with the eroded and expanded images obtained for this original image after, respectively, an erosion operation and an expansion operation by a structural element of size 3×3. The erosion operation consists in determining, for each pixel p(m,n) of the original image, a weighting we(m,n) corresponding to the minimum of the weightings wo(x,y) of the pixels p(x,y) belonging to the structural element centered on the pixel p(m,n) in question. Conversely, the expansion operation consists in determining, for each pixel p(m,n) of the original image, a weighting wf(m,n) corresponding to the maximum of the weightings wo(x,y) of the pixels p(x,y) belonging to the structural element centered on the pixel p(m,n) in question.

Figure 5:
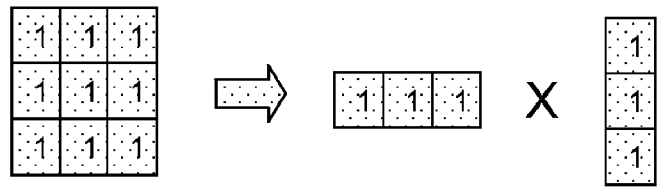
FIG. 5, an illustration of the decomposition of a structural element into two sub-elements.
Figure 6A:
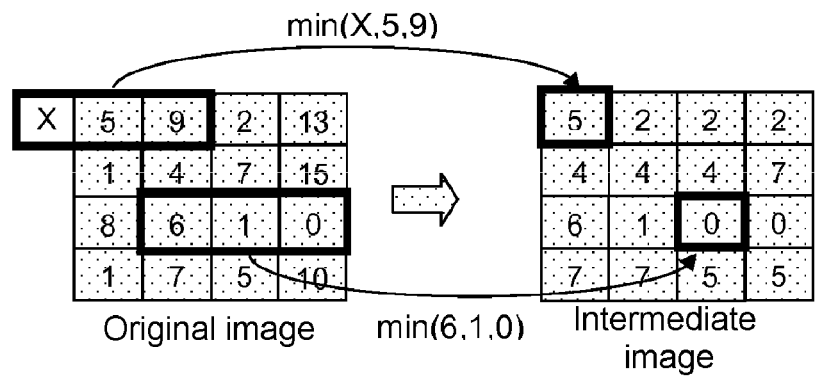
FIG. 6a, an illustration of the principle for determination of an intermediate image obtained by a first step of the erosion operation according to the invention starting from a fourth example of an original image.
Figure 6B:
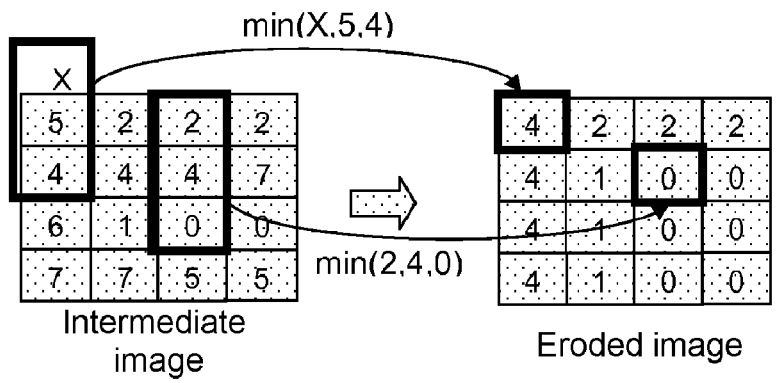

According to the invention, the erosion and expansion operations are each determined using two steps, a first step determining an intermediate image starting from the original image and a second step determining the eroded or expanded image starting from the intermediate image. For this purpose, the structural element of size P×Q is decomposed into two sub-elements, a first sub-element of size 1×Q and a second sub-element of size P×1, as shown in FIG. 5. The intermediate image is then determined by scanning, in other words by going from pixel to pixel, the first sub-element on each row of the original image. The eroded or expanded image is, in turn, determined by scanning the second sub-element in each column of the intermediate image. The following part of the description is presented with regard to the erosion operation for an original image such as is shown in FIG. 6a and a structural element of size 3×3. In the first step, shown in FIG. 6a, the weightings wie(m,n) of the pixels p(m,n) of the intermediate image are determined by considering the minimum of the weightings wo(m,n−1), wo(m,n) and wo(m,n+1) of the pixels p(m,n−1), p(m,n) and p(m,n+1) of the original image. In the second step, shown in FIG. 6b, the weightings we(m,n) of the pixels p(m,n) of the eroded image are determined by considering the minimum of the weightings wie(m−1,n), wie(m,n) and wie(m+1,n) of the pixels p(m−1,n), p(m,n) and p(m+1,n) of the intermediate image. The determination of weightings wie(m,n) for the intermediate image and the weightings we(m,n) for the eroded image may be modeled by the following equations:

$$\forall (m,n)\in[1,M]\times[1,N],$$

$$wie(m,n)=\min[wo(m,n-1),wo(m,n),wo(m,n+1)] \quad (5)$$

$$we(m,n)=\min[wie(m-1,n),wie(m,n),wie(m+1,n)] \quad (6)$$

The particular cases of the first and of the last row (m=1 and m=M) and of the first and of the last column (n=1 and n=N) can easily be handled by considering rows and columns referred to as framing rows and columns. The framing rows (m=0 and m=M+1) can be inserted before the first row (m=1) and after the last row (m=M) of the original image. The weightings wo(0,n) and wo(M+1,n) of all the pixels p(0,n) and p(M+1,n) of these framing rows are, for example, set to the highest value (in the case of an erosion) that the weighting wo(m,n) of the pixels p(m,n) of the original image can take, for example 255. Furthermore, the framing columns (n=0 and n=N+1) can be inserted before the first column (n=1) and after the last column (n=N+1) of the intermediate image. The weightings wie(m,0) and wie(m,N+1) of all the pixels p(m,0) and p(m,n+1) are for example set to the highest value that the weighting wie(m,n) of the pixels p(m,n) of the intermediate image can take, for example 255.

According to another embodiment, the particular cases of the first and of the last row (m=1 and m=M) and of the first and of the last column (n=1 and n=N) can be handled by not considering the rows and the columns situated outside of the original image and of the intermediate image. In other words, the sub-elements of the structural element are reduced at the edges of the image.

It goes without saying that the first and second steps of the erosion operation may be inverted, the intermediate image then being obtained by minima in columns instead of minima on rows.

The expansion operation can be easily obtained by adapting the erosion operation, notably by replacing the minimum operations by maximum operations. The particular cases of the first and last rows and first and last columns can then be handled by setting the value of the weightings in question to the value zero.

Manhattan Distance

Figure 7:
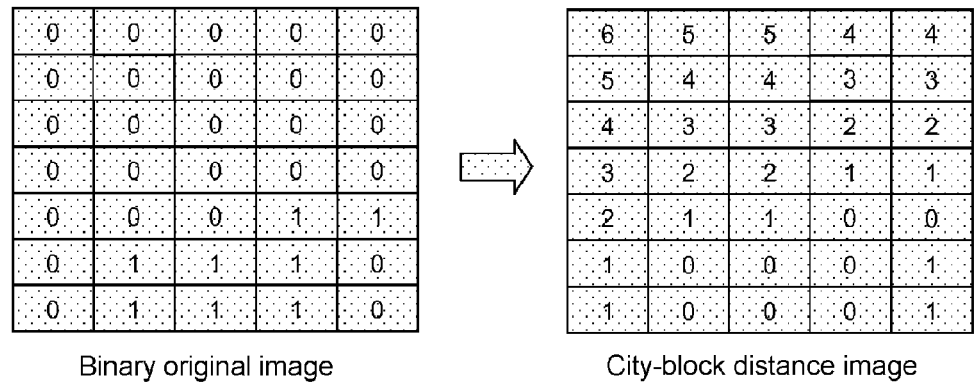
FIG. 7, a fifth example of a binary original image and of a distance image associated with it.
Figure 8:
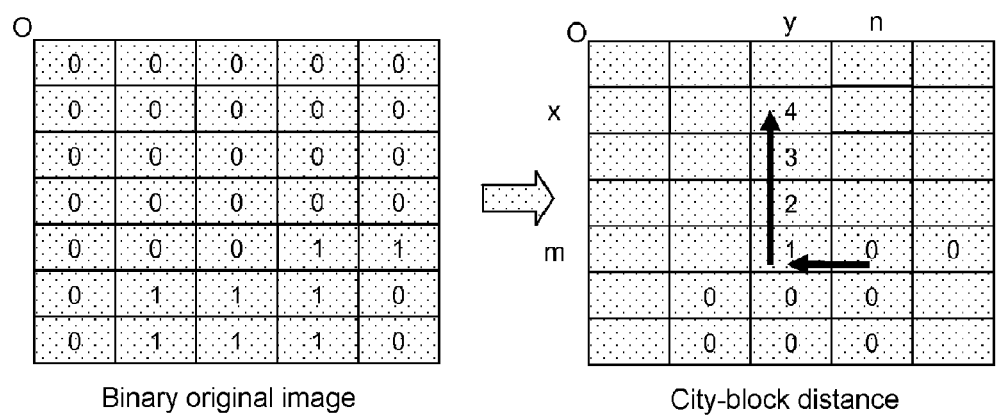
FIG. 8, an illustration of the principle for determination of the distance image starting from the binary original image in FIG. 7.

FIGS. 7 and 8 illustrate the principle of the Manhattan distance operation, also known in the literature by the term "city-block" distance. This operation allows the distance of an object in the image to be determined with respect to any point of the image. For this operation, a binary original image must be used, in other words an image composed of pixels whose weighting can only take one of two values, a first value corresponding to a high state, for example '1', and a second value corresponding to a low state, for example '0'. The binary original image may be obtained by thresholding. The pixels of the binary original image corresponding to the object have, for example, a weighting set to the high state, the other pixels having a weighting set to the low state. The image obtained by the Manhattan distance operation, referred to as distance image, is an image whose weighting $wd(m,n)$ for each pixel $p(m,n)$ is equal to the Manhattan distance between the pixel $p(m,n)$ in question and the pixel $p(x,y)$ closest to the pixel $p(m,n)$ in question belonging to the object. FIG. 7 illustrates an example of a binary original image and the corresponding distance image. The Manhattan distance D between two pixels $p(m,n)$ and $p(x,y)$ is understood to mean the sum of the difference, in absolute value, between the row m of the pixel $p(m,n)$ and the row x of the pixel $p(x,y)$ and of the difference, in absolute value, between the column n of the pixel $p(m,n)$ and the column y of the pixel $p(x,y)$, according to the equation:

$$D=|m-x|+|n-y| \quad (7)$$

FIG. 8 illustrates the calculation of the weighting $wd(2,3)$ of the pixel $p(2,3)$ of the distance image. One of the pixels closest to the pixel $p(2,3)$ belonging to the object is the pixel $p(5,4)$. The weighting $wd(2,3)$ of the pixel $p(2,3)$ can thus be determined by the equation:

$$wd(2,3)=D=|2-5|+|3-4|=4.$$

It may be noted that any other path between the object and the pixel $p(m,n)$ in question would lead to the same Manhattan distance, and hence to the same weighting $wd(m,n)$.

According to the invention, the Manhattan distance operation is, like the other morphological operations according to the invention, determined in two steps. A first step determines an intermediate image starting from the original image, in this case the binary original image, and a second step determines the distance image starting from the intermediate image. In the first step, a structural element in the form of a reversed 'L' (FIG. 10) rotated by a quarter turn in the trigonometric sense, and composed of three pixels $p(m,n-1)$, $p(m,n)$ and $p(m-1,n)$, is successively scanned over each row of the original image starting from the pixel $p(1,1)$. In the case where the central pixel $p(m,n)$ belongs to the object, the weighting $wid(m,n)$ of this same pixel $p(m,n)$ in the intermediate image is set to zero. In the opposite case, the weighting $wid(m,n)$ of the central pixel $p(m,n)$ of the intermediate image is determined by comparing the weighting $V_1=wid(m,n-1)$ of the pixel $p(m,n-1)$ of the intermediate image situated on the same row (m) in the preceding column (n-1) with the weighting $B_1=wid(m-1,n)$ of the pixel $p(m-1,n)$ of the intermediate image situated on the preceding row (m-1) in the same column (n). The weighting $wid(m,n)$ of the central pixel $p(m,n)$ of the intermediate image is then equal to the minimum of the weightings $V_1$ and $B_1$ incremented by one unit, in accordance with the equation:

$$wid(m,n)=\min(V_1+1,B_1+1). \quad (8)$$

In the second step, a structural element, again in the form of an 'L', (FIG. 12) but rotated by a quarter turn in the anti-trigonometric sense, and composed of three pixels $p(m+1,n)$, $p(m,n)$ and $p(m,n+1)$, is successively scanned over each row of the intermediate image starting from the pixel $p(M,N)$. The weighting $wd(m,n)$ of the central pixel $p(m,n)$ of the distance image is then determined by comparing the weighting $r=wid(m,n)$ of the pixel $p(m,n)$ of the intermediate image, the weighting $B_2=wd(m+1,n)$ of the pixel $p(m+1,n)$ of the distance image and the weighting $V_2=wd(m,n+1)$ of the pixel $p(m,n+1)$ of the distance image. The weighting $wd(m,n)$ of the central pixel $p(m,n)$ of the distance image is then equal to the minimum of the weightings $r$, $B_2+1$ and $V_2+1$, in accordance with the equation:

$$wd(m,n)=\min(r,B_2+1,V_2+1). \quad (9)$$

According to one particular embodiment, in the second step, it is also verified whether the central pixel $p(m,n)$ belongs to the object. In the case where the central pixel $p(m,n)$ belongs to the object, the weighting $wd(m,n)$ of this same pixel $p(m,n)$ in the distance image is set to zero. In the opposite case, the weighting $wd(m,n)$ of the pixel $p(m,n)$ is determined by the equation 9. This particular embodiment allows the second step to be matched to the first.

Figure 9:
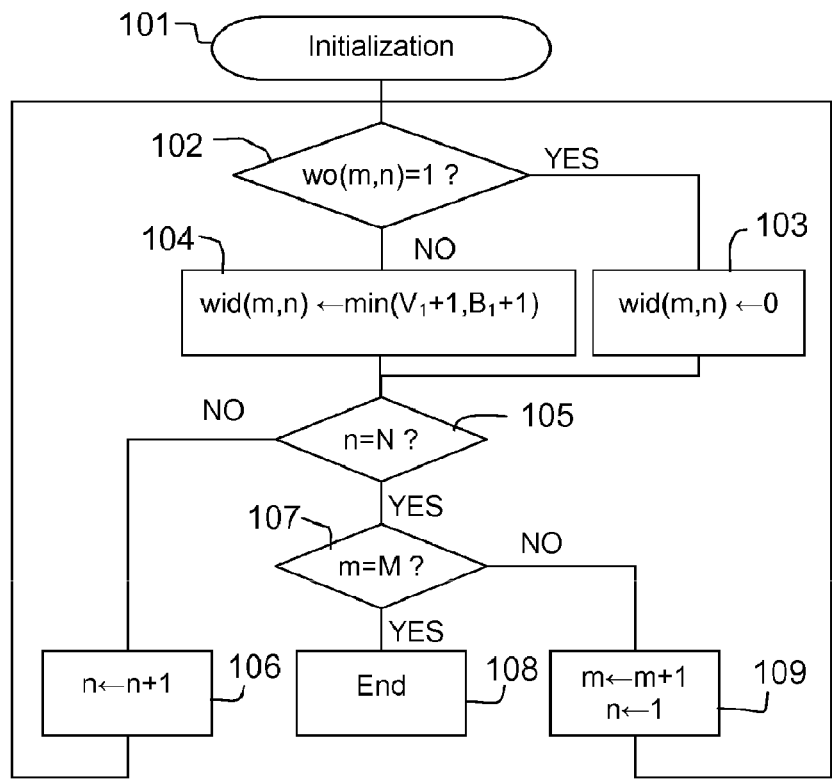
FIG. 9, sub-steps of the city-block distance operation according to the invention allowing an intermediate image to be obtained starting from a binary original image.

FIG. 9 illustrates sub-steps of the first step. In a first sub-step, referred to as initialization step 101, an initialization row (m=0) and an initialization column (n=0) are inserted, respectively, before the first row (m=1) and before the first column (n=1) of the intermediate image. The weightings $wid(0,n)$ and $wid(m,0)$ of the pixels $p(0,n)$ and $p(m,0)$ of the initialization row (m=0) and of the initialization column (n=0) are set with respect to a reference value Vref and to a number Nmax of pixels $p(m,n)$, this number Nmax corresponding to the maximum distance between a given pixel $p(m,n)$ and an object in the image. The number Nmax may be determined by the following equation:

$$N\max=(N-1)+(M-1)$$

The reference value Vref is determined so as to be greater than the number Nmax. It corresponds for example to the maximum value of a register. In the case of VGA resolution images, Vref can be set to the value 2048, i.e an 11-bit register. In the case of images with a resolution referred to as "full HD", in other words comprising a matrix of 1920*1080 pixels, Vref can be set to 4096, i.e a 12-bit register.

The weightings $wid(0,n)$ and $wid(m,0)$ can be equal to the reference value Vref minus the number Nmax, in accordance with the equations:

$$\forall n \in [1,N], wid(0,n)=V\text{ref}-N\max \quad (10a)$$

$$\forall m \in [1,M], wid(m,0)=V\text{ref}-N\max \quad (10b)$$

Figure 10:
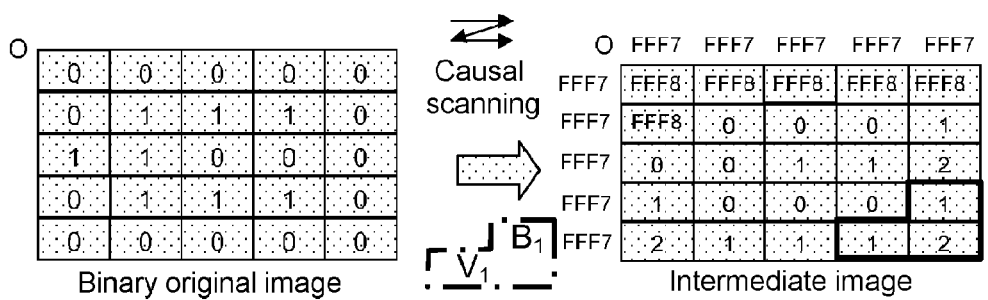
FIG. 10, an example of a binary original image and an intermediate image obtained starting from the sub-steps in FIG. 9.

By considering the original image in FIG. 10 of size 5×5 and by taking as reference value Vref the hexadecimal value FFFF, corresponding to a 16-bit register, these equations become:

$$\forall n \in [1,5], wid(0,n)=FFFF-[(5-1)+(5-1)]=FFF7$$

$$\forall m \in [1,5], wid(m,0)=FFFF-8=FFF7$$

Still in the initialization step 101, the row index m and the column index n are reset to the value '1'. In a second sub-step 102, it is verified whether the central pixel $p(m,n)$ belongs to the object, for example by verifying that its weighting $wo(m,n)$ in the original image is equal to the value '1'. If such is the case, the weighting $wid(m,n)$ of this pixel in the intermediate image is set to zero in a sub-step 103 in order to indicate a distance of zero between this pixel and the object. In the opposite case, the weighting wid(m,n) of the central pixel p(m,n) of the intermediate image is set, in a sub-step 104, to the minimum value of the weightings $V_1$ and $B_1$ incremented by one unit, in accordance with the equation 8. At the end of the sub-step 103 or of the sub-step 104, it is checked, in a sub-step 105, whether the structural element has arrived at the end of the row. This condition is for example verified when the column index n is equal to the number N of columns. If this condition is not verified, the column index n is incremented by one unit in a sixth sub-step 106. At the end of this sub-step 106, a new iteration is executed starting from the second sub-step 102 in order to determine the weighting wid(m,n+1) of the next pixel p(m,n+1) in the row. On the other hand, if the structural element has arrived at the end of the row, it is checked, in a sub-step 107, whether the structural element has also arrived at the end of the column, in other words whether the central pixel p(m,n) corresponds to the last pixel p(M,N) of the image. If this condition is verified, the first step is terminated in a sub-step 108, the intermediate image being completely determined. The intermediate image thus obtained is illustrated in FIG. 10 (example with a 16-bit counter). If the condition in the sub-step 107 is not verified, the row index m is incremented by one unit and the column index n is reset to the value '1' in a sub-step 109. At the end of this sub-step 109, a new iteration is executed starting from the second sub-step 102.

Figure 11:
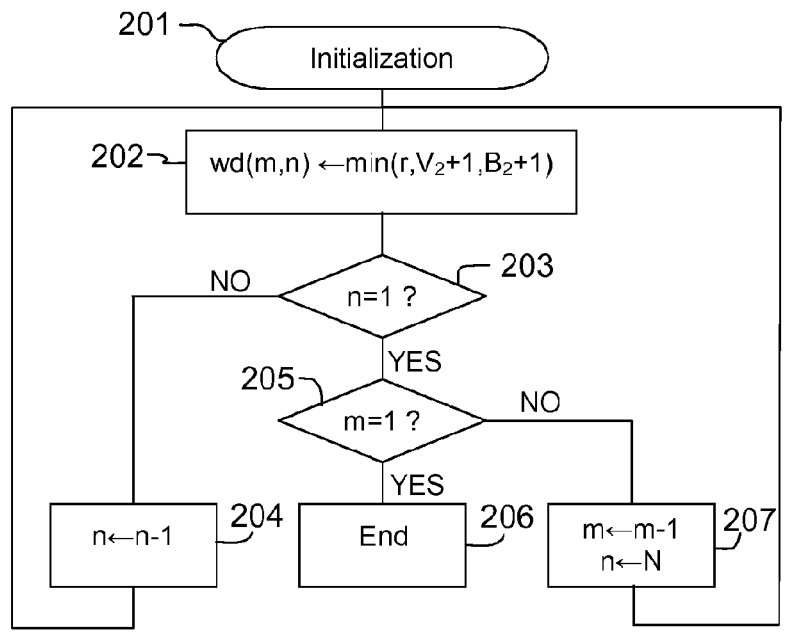
FIG. 11, sub-steps of the city-block distance operation according to the invention allowing a distance image to be obtained starting from an intermediate image.

FIG. 11 illustrates sub-steps of the second step. This second step is for example executed following the sub-step 108. In a first sub-step, called initialization step 201, an initialization row (m=M+1) and an initialization column (n=N+1) are inserted, respectively, after the last row (m=M) and after the last column (n=N) of the distance image. The weightings wd(M+1,n) and wd(m,N+1) of the pixels p(M+1,n) and p(m,N+1) of the initialization row (m=M+1) and of the initialization column (n=N+1) are set as a function of the reference value Vref set during the first step, in accordance with the equations:

$$\forall n \in [1,N], wd(M+1,n)=Vref-1 \quad (11a)$$

$$\forall m \in [1,M], wd(m,N+1)=Vref-1 \quad (11b)$$

Figure 12:
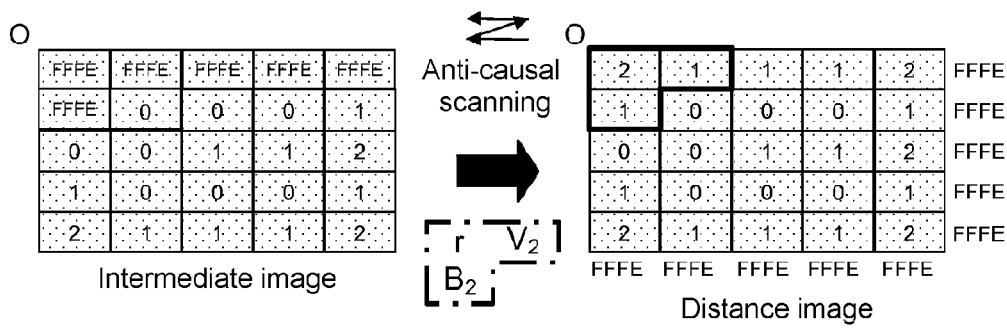
FIG. 12, the intermediate image in FIG. 10 and a distance image obtained starting from the sub-steps in FIG. 11.

Considering the intermediate image in FIG. 10, reproduced in FIG. 12, these equations become:

$$\forall n \in [1,5], wd(M+1,n)=FFFF-1=FFFE$$

$$\forall m \in [1,5], wd(m,N+1)=FFFF-1=FFFE$$

Still in the initialization step 201, the row index m is reset to the value 'M' and the column index n is reset to the value 'N'. In a second sub-step 202, the weighting wd(m,n) of the central pixel p(m,n) of the distance image is set to the minimum value of the weightings r, $B_2+1$ and $V_2+1$, in accordance with the equation 9. At the end of the sub-step 202, it is checked, in a sub-step 203, whether the structural element has arrived at the end of the row. This condition is for example verified when the column index n is equal to the value '1'. If this condition is not verified, the column index n is decremented by one unit in a sub-step 204. At the end of this sub-step 204, a new iteration is executed starting from the second sub-step 202 in order to determine the weighting wd(m,n−1) of the next pixel p(m,n−1) in the row. On the other hand, if the structural element has arrived at the end of the row, it is checked, in a sub-step 205, whether the structural element has also arrived at the end of the column, in other words whether the central pixel p(m,n) corresponds to the first pixel p(1,1) of the image. If this condition is verified, the second step is terminated in a sub-step 206, the distance image being completely determined. The distance image thus obtained is illustrated in FIG. 12. If the condition in the sub-step 205 is not verified, the row index m is decremented by one unit and the column index n is reset to the value 'N' in a sub-step 207. At the end of this sub-step 207, a new iteration is executed starting from the second sub-step 202.

Projection

Figure 13:
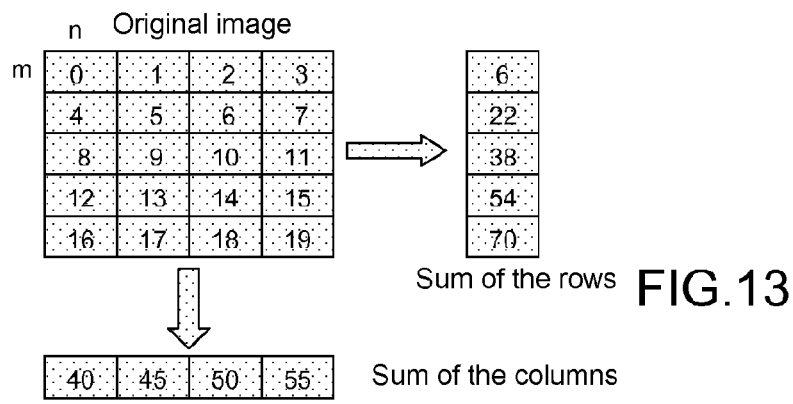
FIG. 13, an illustration of the projection operation.

FIG. 13 illustrates the projection operation. This operation allows a new row (m=X) and a new column (n=Y) to be determined starting from an original image, the weightings wp(X,n) of the pixels p(X,n) of the new row being respectively equal to the sum of the weightings wo(m,n) of all the pixels p(m,n) of the corresponding column in the original image, and the weightings wp(m,Y) of the pixels p(m,Y) of the new column being respectively equal to the sum of the weightings wo(m,n) of all the pixels p(m,n) of the corresponding row in the original image. The weightings wp(X,n) and wp(m,Y) of the pixels p(X,n) and p(m,Y) of the new row and of the new column can be modeled by the equations:

$$\forall n \in [1, N], \quad wp(X, n) = \sum_{x=1}^{M} wo(x, n) \quad (12a)$$

$$\forall m \in [1, M], \quad wp(m, Y) = \sum_{y=1}^{N} wo(m, y) \quad (12b)$$

Description of the Reconfigurable Module

Operational Block

Figure 14:
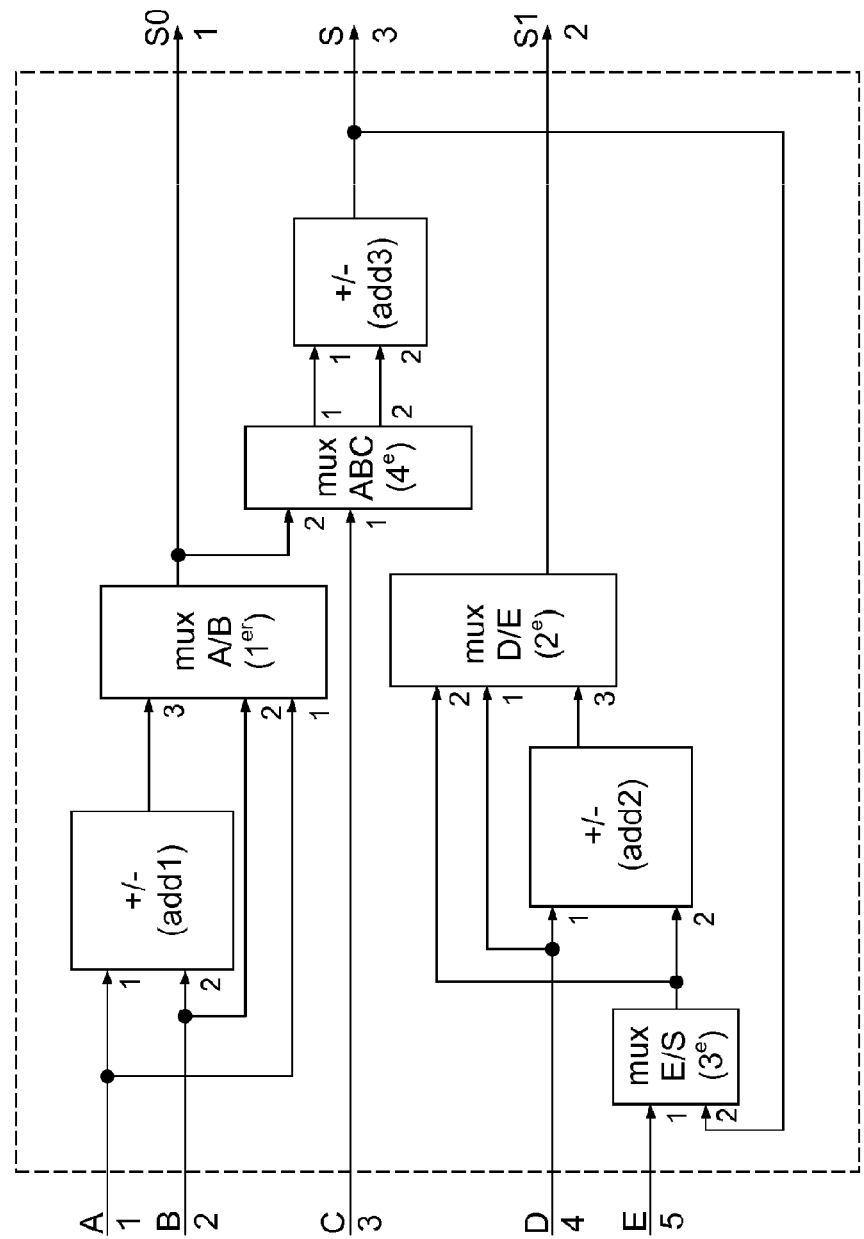
FIG. 14, an example of operational block.

FIG. 14 shows schematically an operational block of a reconfigurable module according to the invention. The operational block comprises five inputs, identified by the letters A, B, C, D and E, and three outputs, indentified by S0, S1 and S. These inputs/outputs notably allow the operations defined hereinabove to be carried out. They also allow variants of these operations to be carried out and other additional functions not described here. The operational block also comprises three adders/subtracters and four logic blocks whose configuration allows a result of an operation carried out on the inputs A, B, C, D and/or E to be delivered at each output S0, S1 and S, the result depending on the type of operation performed by the adders/subtracters and on the links established between the inputs and the outputs of the various logic blocks. For the sake of conciseness, the inputs A, B, C, D and E, the outputs S0, S1 and S, together with the inputs/outputs of the adders/subtracters and of the logic blocks, are confounded with the data present on these inputs and these outputs. Logic block is understood to mean a controlled circuit having one or more inputs and one or more outputs, where each output may be linked with one of the inputs depending on a command applied to the logic block, for example by a general controller or by a logic internal to the logic block. The term logic block is to be understood in the wider sense. It goes without saying that a logic block having several inputs and/or outputs can be formed by an assembly of multiplexers and of logic gates each having one or more inputs and one or more outputs.

According to the invention, the first output S0 of the operational block can deliver either the result of the addition (A+B) of the first input A and the second input B of the operational block, or the result of the subtraction (A−B) of the second input B from the first input A of the operational block, or the minimum (min(A, B)) of the first input A and the second input B of the operational block, or the maximum (max(A, B)) of the first input A and the second input B of the operational block. The second output S1 of the operational block can deliver either the result of the addition (D+E) of the fourth input D and the fifth input E of the operational block, or the result of the subtraction (D−E) of the fifth input E from the fourth input D of the operational block, or the minimum (min(D, E)) of the fourth input D and the fifth input E of the operational block, or the maximum (max(D, E)) of the fourth input D and the fifth input E of the operational block, or the minimum (min(A, B, D)) of the first input A, the second input B and the fourth input D of the operational block, or the maximum (max(A, B, D)) of the first input A, the second input B and the fourth input D of the operational block. The third output S of the operational block can deliver either the result of the addition (S0+C) of the first output S0 and the third input C of the operational block, or the result of the subtraction (S0−C) of the third input C from the first output S0.

The various combinations of results at the three outputs S0, S1 and S of the operational block allow the five morphological operations previously described to be performed with a minimum of components presents in the reconfigurable module. Consequently, it is possible to conserve silicon surface area, and hence to reduce the size and the cost of the reconfigurable module. Furthermore, since the reconfigurable module according to the invention corresponds to an architecture known as a pipeline architecture, a result can be supplied at each clock pulse. The result can be the weighting of a pixel from an intermediate image or the weighting of a pixel from an integral image, from an eroded image, from an expanded image or from a distance image. The morphological operations can thus be carried out very rapidly.

The results that can be obtained at the outputs S0, S1 and S of the operational block result for example from the configuration of the adders/subtracters and of the logic blocks described hereinafter. According to this configuration, the first input A and the second input B of the operational block are respectively connected to a first and to a second input of a first adder/subtracter add 1 and to a first and to a second input of a first logic block mux A/B. An output of the first adder/subtracter add 1 is connected to a third input of the first logic block mux A/B. An output of this first logic block mux A/B forms the first output S0 of the operational block. Again according to this configuration, the fourth input D of the operational block is connected to a first input of a second adder/subtracter add 2 and to a first input of a second logic block mux D/E. The fifth input E of the operational block is connected to a first input of a third logic block mux E/S. An output of this third logic block mux E/S is connected to a second input of a second adder/subtracter add 2 and to a second input of the second logic block mux D/E. An output of the second adder/subtracter add 2 is connected to a third input of the second logic block mux D/E. An output of the second logic block mux D/E forms the second output S1 of the operational block. Again according to this configuration, the third input C of the operational block and the output of the first logic block mux A/B are respectively connected to a first and to a second input of a fourth logic block mux ABC. A first and a second output of this fourth logic block mux ABC are respectively connected to a first and to a second input of a third adder/subtracter add 3. An output of the third adder/subtracter add 3 is connected to a second input of the third logic block mux E/S and forms the third output S of the operational block.

According to one particular embodiment, the first output S0 of the operational block delivers the minimum (min(A, B)) or the maximum (max(A, B)) of the first and second inputs A and B of the operational block by carrying out a subtraction (A−B) of the second input B from the first input A of the operational block and monitoring the sign of the result of the subtraction (A−B). The sign of the result of the subtraction is for example given by the sign bit of the first adder/subtracter add 1. For the minimum (min(A, B)), if the result of the subtraction (A−B) is negative, a link is established between the first input and the output of the first logic block mux A/B, and if the result of the subtraction (A−B) is positive, a link is established between the second input and the output of the first logic block mux A/B. For the maximum (max(A, B)), if the result of the subtraction (A−B) is positive, a link is established between the first input and the output of the first logic block mux A/B, and if the result of the subtraction (A−B) is negative, a link is established between the second input and the output of the first logic block mux A/B. The same principle may be applied to the second adder/subtracter add 2 and to the second logic block mux D/E in order to determine the minimum (min(D, E)) or the maximum (max(D, E)) of the fourth and fifth inputs D and E of the operational block. The sign of the result of the subtraction (D−E) of the fifth input E from the fourth input D of the operational block determines the link to be established between the output and the first or the second input of the second logic block mux D/E.

Reconfigurable Module

Figure 15:
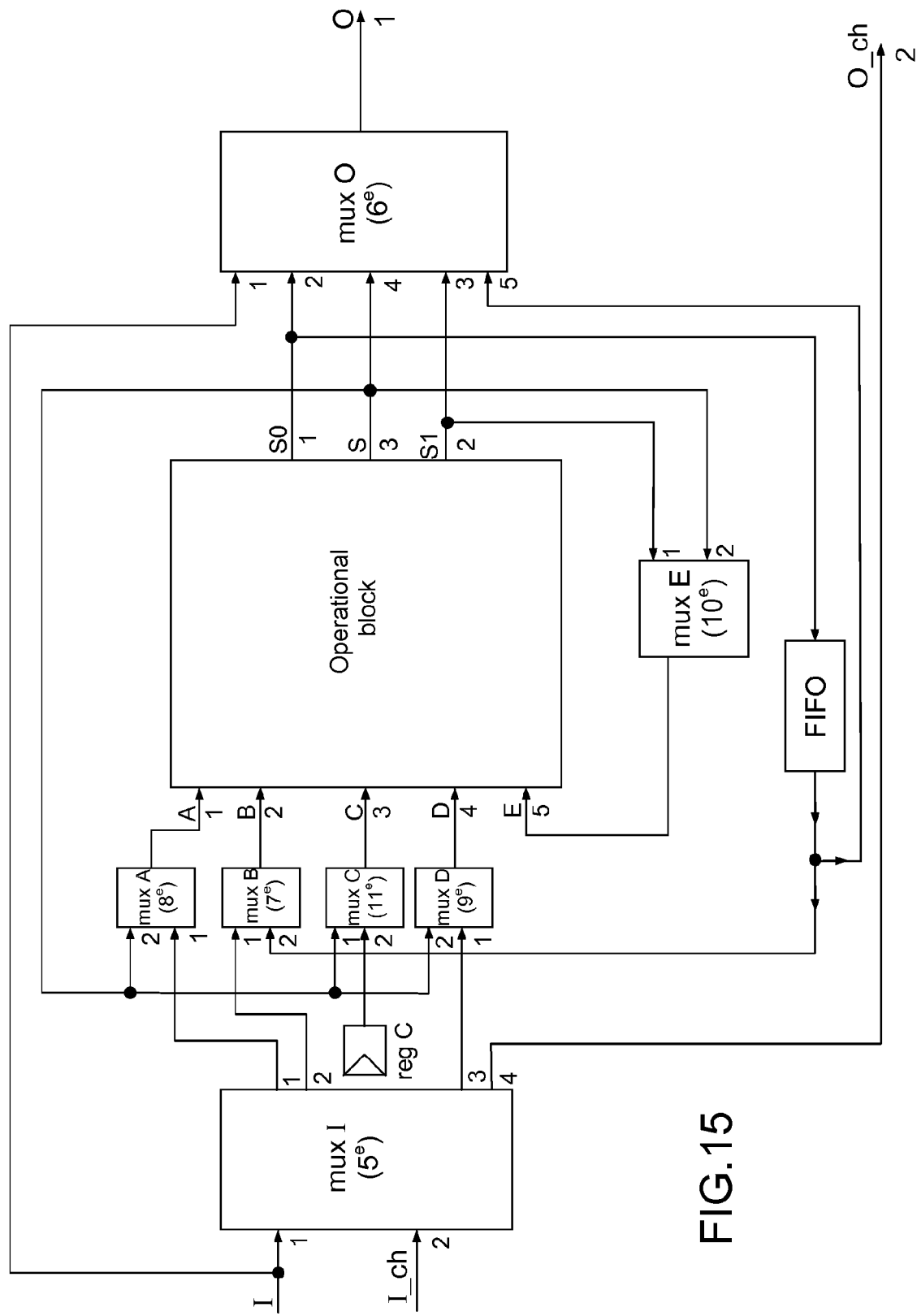
FIG. 15, a reconfigurable module comprising the operational block in FIG. 14.

According to one particular embodiment, shown in FIG. 15, the reconfigurable module comprises a first input I, a second input I_ch, a first output O, a second output O_ch, a fifth logic block mux I allowing the data stream entering the operational block to be controlled and a sixth logic block mux O allowing the data stream exiting the operational block to be controlled. In particular, the first input I of the reconfigurable module can be connected to a first input of the fifth logic block mux I and to a first input of the sixth logic block mux O. The second input I_ch can be connected to a second input of the fifth logic block mux I. A first, a second and a third output of the fifth logic block mux I can respectively be connected to the first, to the second and to the fourth input A, B, D of the operational block. The first, second and third outputs S0, S1, S of the operational block can respectively be connected to a second, to a third and to a fourth input of the sixth logic block mux O. An output of the logic block mux O forms the first output O of the reconfigurable module and a fourth output of the logic block mux I forms the second output O_ch of the reconfigurable module. This second output O_ch is able to be connected to the input I_ch of a second reconfigurable module in the case of a cascade configuration. In other words, the reconfigurable module according to the invention can be series combined in order to carry out more complex morphological operations, such as erosion or expansion operations by structural elements of dimensions higher than 3×3.

According to one particular embodiment, shown in FIG. 15, the reconfigurable module comprises a FIFO stack allowing data to be temporarily stored and a seventh logic block mux B allowing the data stream entering the second input B of the operational block to be controlled. FIFO stack is understood to mean a stack whose first input data bit is the first to be output. The second output of the fifth logic block mux I can be connected to a first input of the logic block mux B. An output of this logic block mux B can be connected to the second input B of the operational block. The first output S0 of the operational block can be connected to an input of the FIFO stack, and an output of the FIFO stack can be connected to a second input of the seventh logic block mux B and to a fifth input of the sixth logic block mux O.

According to one particular embodiment, shown in FIG. 15, the reconfigurable module comprises means for re-injecting the data present on the outputs S1 and S of the operational block at the input of the operational block. In particular, these means can comprise an eighth logic block mux A, a ninth logic block mux D and a tenth logic block mux E. The first and third outputs of the fifth logic block mux I can respectively be connected to a first input of the eighth logic block mux A and to a first input of the ninth logic block mux D. The third output S of the operational block can be connected to a second input of the eighth logic block mux A, to a second input of the ninth logic block mux D and to the third input C of the operational block. The second and third outputs S1, S of the operational block can respectively be connected to a first and to a second input of the tenth logic block mux E, and an output of this logic block mux E can be connected to the fifth input E of the operational block.

According to one particular embodiment, shown in FIG. 15, the reconfigurable module comprises a data register reg C and an eleventh logic block mux C. The third output S of the operational block and the data register reg C can respectively be connected to a first and to a second input of the logic block mux C. An output of this logic block mux C can be connected to the third input C of the operational block. This particular embodiment allows operations to be performed with data of predetermined value, for example "zero" and "one".

Description of the Method of Implementing the Reconfigurable Module

The reconfigurable module described hereinabove can be implemented for carrying out the morphological operations also described hereinabove. In particular, starting from an original image comprising M rows and N columns of pixels $p(m,n)$, the reconfigurable module can determine either an integral image, or an eroded image, or an expanded image, or a Manhattan distance image, or a projection along the rows and the columns of the original image, this being carried out depending on the type of operation performed by the adders/subtracters add 1 to add 3 and on the links established between the inputs and the outputs of the various logic blocks.

Integration

According to one particular embodiment, the determination of the integral image comprises the following steps:

define an intermediate image of same dimensions as the original image, there being a weighting $wii(m,n)$ associated with each pixel $p(m,n)$ of the intermediate image, initialize the weightings $wii(1,n)$ of the pixels $p(1,n)$ of the first row ($m=1$) of the intermediate image, iterate the following steps for n varying from 2 to N:
iterate the following steps for m varying from 2 to M:
add the weightings $wo(m,n)$ of the pixels $p(m,n)$ of the original image with the weightings $wii(m-1,n)$ of the pixels $p(m-1,n)$ of the intermediate image,
store the results of the additions in the FIFO stack, the FIFO stack being of size M−1,
initialize the weightings $wi(m,1)$ of the pixels $p(m,1)$ of the first column ($n=1$) of the integral image,
iterate the following steps for m varying from 2 to M:
iterate the following steps for n varying from 2 to N:
add the weightings $wii(m,n)$ of the pixels $p(m,n)$ of the intermediate image to the weightings $wi(m,n-1)$ of the pixels $p(m,n-1)$ of the integral image.

These steps are particularly well adapted to the reconfigurable module according to the invention. In particular, the step for addition of the weightings $wo(m,n)$ of the pixels $p(m,n)$ of the original image to the weightings $wii(m-1,n)$ of the pixels $p(m-1,n)$ of the intermediate image can be carried out in the following manner. The weightings $wo(m,n)$ are injected into the first input I of the reconfigurable module; the fifth and eighth logic blocks mux I, mux A connect the first input I of the reconfigurable module to the first input A of the operational block; the seventh logic block mux B connects the output of the FIFO stack to the second input B of the operational block. Thus, the operational block can perform the addition of the weightings $wo(m,n)$ and $wii(m-1,n)$. The sixth logic block mux O connects the output S0 of the operational block to the output O of the reconfigurable module in order to supply, at this output O and at each clock pulse, a weighting $wii(m,n)$ of a pixel $p(m,n)$ of the intermediate image.

Furthermore, the step for addition of the weightings $wii(m,n)$ of the pixels $p(m,n)$ of the intermediate image to the weightings $wi(m,n-1)$ of the pixels $p(m,n-1)$ of the integral image can be carried out in the following manner. The weightings $wii(m,n)$ are injected into the first input I of the reconfigurable module; the fifth and eighth logic blocks mux I, mux A connect the first input I of the reconfigurable module to the first input A of the operational block. The seventh logic block mux B connects the output of the FIFO stack to the second input B of the operational block. Thus, the operational block can perform the addition of the weightings $wii(m,n)$ and $wi(m,n-1)$, the latter coming from the FIFO stack. The sixth logic block mux O connects the output S0 of the operational block to the output O of the reconfigurable module in order to supply, at this output O and at each clock pulse, a weighting $wi(m,n)$ of a pixel $p(m,n)$ of the integral image.

The preceding steps, required for the calculation of the integral image, are carried out in the operational block by adding the first input A and the second input B of the operational block using the adder add 1. The result is routed to the output S0 via the first logic block mux A/B.

The initialization step for the weightings $wii(1,n)$ of the pixels $p(1,n)$ of the first row ($m=1$) of the intermediate image can be carried out by setting these weightings $wii(1,n)$ to the same values as the weightings $wo(1,n)$ of the pixels $p(1,n)$ of the first row ($m=1$) of the original image. Similarly, the initialization step for the weightings $wi(m,1)$ of the pixels $p(m,1)$ of the first column ($n=1$) of the integral image can be carried out by setting these weightings $wi(m,1)$ to the same values as the weightings $wii(m,1)$ of the pixels $p(m,1)$ of the first column ($n=1$) of the intermediate image.

Erosion—Expansion

According to one particular embodiment, the determination of the eroded image by a structural element of dimension 3×3 comprises the following steps:

decompose the structural element into a first sub-structural element of dimension 1×3 and into a second sub-structural element of dimension 3×1, define an intermediate image of same dimensions as the original image, there being associated a weighting $wie(m,n)$ with each pixel $p(m,n)$ of the intermediate image, iterate the following steps for m varying from 1 to M:
iterate the following steps for n varying from 1 to N:
assign to the weighting $wie(m,n)$ the minimum of the weightings $wo(x,y)$ of the pixels $p(x,y)$ belonging to the first sub-structural element centered on the pixel $p(m,n)$ in question,
iterate the following steps for n varying from 1 to N:
iterate the following steps for m varying from 1 to M:

assign to the weighting we(m,n) the minimum of the weightings wie(x,y) of the pixels p(x,y) belonging to the second sub-structural element centered on the pixel p(m,n) in question.

These steps can be obtained by the reconfigurable module by injecting the weighting wo(x,y) or wie(x,y) into the first input I of the reconfigurable module, the fifth logic block mux I successively connecting the first input I of the reconfigurable module to the first input A of the operational block via the eighth logic block mux A, to the second input B of the operational block via the seventh logic block mux B and to the fourth input D of the operational block via the ninth logic block mux D. The tenth logic block mux E connects the third output S to the fifth input E of the operational block. The operational block can thus determine the minimum of the weightings wo(x,y) or wie(x,y) of the pixels p(x,y) belonging to the first or to the second sub-structural element centered on the pixel p(m,n). The sixth logic block mux O connects the second output S1 of the operational block to the first output O of the reconfigurable module in order to supply, at this output O and at each clock pulse, either the weighting wie(m,n) of the pixels p(m,n) of the intermediate image, or the weighting we(m,n) of the pixels p(m,n) of the eroded image.

The assignment to the weightings wie(m,n) and we(m,n), respectively, of the minimum of the weightings wo(x,y) of the pixels p(x,y) belonging to the first sub-structural element and of the minimum of the weightings wie(x,y) of the pixels p(x,y) belonging to the second sub-structural element can comprise the following steps:

subtract the second input (B) from the first input (A) of the first adder/subtracter add 1, establish a link between the first input (A) or the second input (B) and the output of the first logic block mux A/B depending on the sign of the result of the subtraction (A−B), establish a link between the second input and the first output of the fourth logic block mux ABC, add or subtract the first input of the third adder/subtracter add 3 to or from the value zero, establish a link between the first input and the output of the third logic block mux E/S, subtract the second input (E=S=A or E=S=B) from the first input (D) of the second adder/subtracter add 2, establish a link between the first or the second input (D, E=S=A or E=S=B) and the output of the second logic block mux D/E depending on the sign of the result of the second subtraction (D−E).

The steps allowing the expanded image to be determined by a structural element of dimension 3×3 can easily be deduced from the preceding steps relating to the determination of the eroded image, the minimum operations being simply replaced by maximum operations.

The reconfigurable module according to the invention also enables an eroded image or an expanded image to be rapidly determined by a structural element of dimensions higher than 3×3, for example 5×5. In particular, for an erosion by a structural element of dimensions 5×5, a comparison of 5 values needs to be made and the minimum of these 5 values retained. The idea is to apply the pipeline mode carried out by a reconfigurable module for a 3×3 erosion by using two reconfigurable modules and by distributing the 5 values over the two modules in order to be able to compare them.

Figure 16:
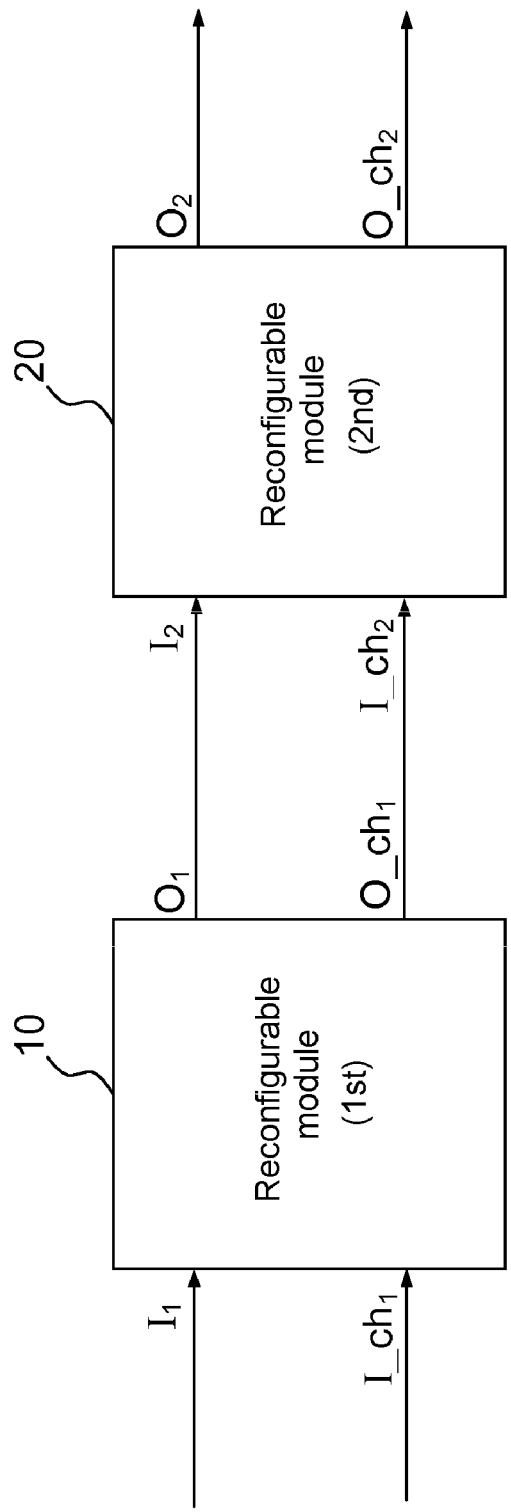
FIG. 16, an example of serial combination of two reconfigurable modules according to FIG. 15.

FIG. 16 illustrates an example of an arrangement of two serially combined reconfigurable modules allowing an eroded image to be obtained by a structural element of dimensions 5×5. The first output $O_1$ of a first reconfigurable module 10 is connected to the first input $I_2$ of a second reconfigurable module 20 and the second output $O\_ch_1$ of the first reconfigurable module 10 is connected to the second output $O\_ch_2$ of the second reconfigurable module 20. The weightings wo(x,y) or wie(x,y) are then injected into the first input $I_1$ of the first reconfigurable module 10, the second input $I\_ch_1$ of the first reconfigurable module 10 being unused. The minimum of the weightings wo(x,y) of three pixels p(x,y) belonging to the first sub-structural element or the minimum of the weightings wie(x,y) of three pixels belonging to the second sub-structural element can then be obtained at the first output $O_1$ of the first reconfigurable module 10, the weightings wo(x,y) or wie(x,y) of the other two pixels p(x,y) belonging to the sub-structural element in question being simply transferred to the second reconfigurable module 20 via the output $O\_ch_1$ and the second input $I\_ch_2$. The minimum of the weightings wo(x,y) or wie(x,y) of the five pixels p(x,y) belonging to the sub-structural element in question can then be obtained at the first output $O_2$ of the second reconfigurable module 20.

It goes without saying that the serial combination described hereinabove also allows expanded images to be obtained by a structural element of dimensions 5×5. Furthermore, the reconfigurable module according to the invention is particularly well adapted to the serial combination of two or more reconfigurable modules. Such a serial combination allows structural elements of greater dimensions to be used. For example, a serial combination of three reconfigurable modules allows structural elements of dimensions 7×7 to be used.

Distance

According to one particular embodiment, the determination of the distance image comprises the following steps:

define an intermediate image of same dimensions as the original image, there being associated a weighting wid(m,n) with each pixel p(m,n) of the intermediate image, define a first structural element composed of three pixels, a central pixel p(m,n), a pixel p(m,n−1) situated on the same row as the central pixel p(m,n) in the preceding column and a pixel p(m−1,n) situated in the same column as the central pixel p(m,n) on the preceding row, iterate the following steps for m varying from 1 to M:
iterate the following steps for n varying from 1 to N:
determine whether the central pixel p(m,n) belongs to the object,
if such is the case, assign the value zero to the weighting wid(m,n), the sixth logic block mux O connecting the first input I of the reconfigurable module to the first output O of the reconfigurable module,
otherwise, assign to the weighting wid(m,n) the minimum of the weightings wid(m,n−1)=$V_1$ and wid(m−1,n)=$B_1$ incremented by one unit, the sixth logic block mux O connecting the third output S of the operational block to the first output O of the reconfigurable module, define a second structural element composed of three pixels, a central pixel p(m,n), a pixel p(m+1,n) situated on the same column as the central pixel p(m,n) on the next row and a pixel p(m,n+1) situated on the same row as the central pixel in the following column, iterate the following steps for m varying from M to 1:
iterate the following steps for n varying from N to 1:
assign to the weighting wd(m,n) of the central pixel p(m,n) the minimum of the weightings wid(m,n)=r, wd(m+1,n)+1=$B_2$+1 and wd(m,n+1)+1=$V_2$+1.

The steps for m varying from 1 to M and for n varying from 1 to N can be obtained by the reconfigurable module, notably when the seventh logic block mux B connects the output of the FIFO stack to the second input B of the operational block and the eighth logic block mux A connects the third output S of the operational block to the first input A of the operational block.

The steps for m varying from M to 1 and for n varying from N to 1 can be obtained by the reconfigurable module, notably when the fifth and ninth logic blocks mux I, mux D connect the first input I of the reconfigurable module to the fourth input D of the operational block, the sixth logic block mux O connects the second output S1 of the operational block to the first output O of the reconfigurable module, the seventh logic block mux B connects the output of the FIFO stack to the second input B of the operational block and the eighth logic block mux A connects the third output S of the operational block to the first input A of the operational block.

The assignment to the weighting wid(m,n) of the minimum of the weightings $V_1$ and $B_1$ incremented by one unit can comprise the following steps:
 subtract the second input B, receiving the weighting $B_1$, from the first input A, receiving the weighting $V_1$, of the first adder/subtracter add 1,
 establish a link between the first input, receiving the weighting $V_1$, or the second input, receiving the weighting $B_1$, and the output of the first logic block mux A/B depending on the sign of the result of the subtraction $(V_1-B_1)$,
 establish a link between the second input, receiving the weighting $B_1$ or $V_1$, and the first output and between the first input, connected to the input C, and the second output of the fourth logic block mux ABC,
 add the value "one" to the first input of the third adder/subtracter add 3, the eleventh logic block mux C connecting the data register reg C to the third input C of the operational block.

Furthermore, the assignment to the weighting wd(m,n) of the minimum of the weightings r, $B_2+1$ and $V_2+1$ can comprise the following steps:
 subtract the second input, receiving the weighting $B_2$, from the first input, receiving the weighting $V_2$, of the first adder/subtracter add 1,
 establish a link between the first input, receiving the weighting $V_2$, or the second input, receiving the weighting $B_2$, and the output of the first logic block mux A/B depending on the sign of the result of the subtraction $(V_2-B_2)$,
 establish a link between the second input, receiving the weighting $B_2$ or $V_2$, and the first output and between the first input, connected to the input C, and the second output of the fourth logic block mux ABC,
 add the value "one" to the first input of the third adder/subtracter add 3, the eleventh logic block mux C connecting the data register reg C to the third input C of the operational block,
 establish a link between the output of the third adder/subtracter add 3 and the second input of the second adder/subtracter add 2 via the third logic block mux E/S,
 subtract the second input, receiving the weighting $B_2+1$ or $V_2+1$, from the first input, receiving the weighting r, of the second adder/subtracter add 2,
 establish a link between the first input, receiving the weighting r, or the second input, receiving the weighting $B_2+1$ or $V_2+1$, and the output of the second logic block mux D/E depending on the sign of the result of the subtraction $(r-(B_2+1)$ or $r-(V_2+1))$.

Projection

According to one particular embodiment, the determination of the new row (m=X) and of the new column (n=Y) for the projection operation, respectively referred to as projection row and projection column, comprises the following steps: define a projection row comprising the same number N of columns as there are rows in the original image and a projection column comprising the same number M of rows as there are columns in the original image, there being respectively associated a weighting wp(X,n) and wp(m,Y) with each pixel p(X,n) of the projection row and with each pixel p(m,Y) of the projection column,
 iterate the following steps for m varying from 1 to M:
  iterate the following steps for n varying from 1 to N:
   add the weightings wp(m,Y) of the pixels p(m,Y) of the projection column to the weightings wo(m,n) of the pixels p(m,n) of the original image,
   add the weightings wp(X,n) of the pixels p(X,n) of the projection row to the weightings wo(m,n) of the pixels p(m,n) of the original image.

The step for addition of the weightings wp(m,Y) to the weightings wo(m,n) can be obtained by the reconfigurable module by injecting the weighting wo(m,n) into the first input I of the reconfigurable module. The fifth logic block mux I can connect the first input I of the reconfigurable module to the fourth input D of the operational block via the ninth logic block mux D. The tenth logic block mux E can connect the second output S1 to the fifth input E of the operational block. The operational block can then calculate the sum of the weightings wo(m,n) of the pixels p(m,n) of a row (m) by means of the second adder/subtracter add 2, the third logic block mux E/S connecting the fifth input E of the operational block to the second input of the second adder/subtracter add 2 and the second logic block mux D/E connecting the output of this adder/subtracter add 2 to the second output S1 of the operational block. When n reaches the number N of columns of the original image, the sixth logic block mux O can connect the second output S1 to the first output O of the reconfigurable module in order to enable the result of the sum of a row (m) to be extracted.

The step for addition of the weightings wp(X,n) to the weightings wo(m,n) can be obtained by the reconfigurable module by injecting the weighting wo(m,n) into the first input I of the reconfigurable module. The fifth logic block mux I can connect the first input I of the reconfigurable module to the first input A of the operational block via the eighth logic block mux A. The seventh logic block mux B can connect the output of the FIFO stack to the second input B of the operational block. The operational block can then calculate the sum of the weightings wo(m,n) of the pixels p(m,n) of a column (n) by means of the first adder/subtracter add 1, the results of the additions of the weightings wp(X,n) and wo(m,n) being stored in the FIFO stack and the first logic block mux A/B connecting the output of the first adder/subtracter add 1 to the first output S0 of the operational block. When m reaches the number M of rows of the original image, the FIFO stack contains the results of the sums of the columns. The FIFO stack can then be emptied via the sixth logic block mux O, the latter connecting the output of the FIFO stack to the first output O of the reconfigurable module.

The invention claimed is:
1. A reconfigurable module comprising:
 an operational block including at least one adder/subtracter, at least one logic block, five inputs and three outputs,
 the first output of the operational block being capable of delivering the following results: the result of the addition of the first and second inputs of the operational block, or the result of the subtraction of the second input from the first input of the operational block, or the minimum of the first and second inputs of the operational block, or the maximum of the first and second inputs of the operational block, the second output of the operational block being capable of delivering the following results: the result of the addition of the fourth and fifth inputs of the operational block, or the result of the subtraction of the fifth input from the fourth input of the operational block, or the minimum of the fourth and fifth inputs of the operational block, or the maximum of the fourth and fifth inputs of the operational block, or the minimum of the first, second and fourth inputs of the operational block, or the maximum of the first, second and fourth inputs of the operational block, the third output of the operational block being capable of delivering the following results: the result of the addition of the first output and the third input of the operational block, or the result of the subtraction of the third input from the first output of the operational block the result delivered by any of the first, second and third outputs depending on the type of operation performed by said at least one adder/subtracter and on the links established between the inputs and the outputs of said at least one logic block.

2. The reconfigurable module of claim 1, wherein the first and second inputs of the operational block being respectively connected to a first and to a second input of a first adder/subtracter and to a first and to a second input of a first logic block, an output of the first adder/subtracter being connected to a third input of the first logic block, an output of the first logic block forming the first output of the operational block, the fourth input of the operational block being connected to a first input of a second adder/subtracter and to a first input of a second logic block, the fifth input of the operational block being connected to a first input of a third logic block, an output of the third logic block being connected to a second input of the second adder/subtracter and to a second input of the second logic block, an output of the second adder/subtracter being connected to a third input of the second logic block, an output of the second logic block forming the second output of the operational block, the third input of the operational block and the output of the first logic block being respectively connected to a first and to a second input of a fourth logic block, a first and a second output of the fourth logic block being respectively connected to a first and to a second input of a third adder/subtracter, an output of the third adder/subtracter being connected to a second input of the third logic block and forming the third output of the operational block.

3. The reconfigurable module of claim 2, further comprising means such that the output of the first logic block and the output of the second logic block may be determined, respectively, as a function of the sign of the subtraction of the second input from the first input of the first adder/subtracter and as a function of the sign of the subtraction of the second input from the first input of the second adder/subtracter.

4. The reconfigurable module of claim 1, further comprising two inputs, two outputs, a fifth logic block and a sixth logic block, the first input of the reconfigurable module being connected to a first input of the fifth logic block and to a first input of the sixth logic block, the second input of the reconfigurable module being connected to a second input of the fifth logic block, a first, a second and a third output of the fifth logic block being respectively connected to the first, to the second and to the fourth input of the operational block, the first, second and third outputs of the operational block being respectively connected to a second, to a third and to a fourth input of the sixth logic block, an output of the sixth logic block forming the first output of the reconfigurable module and a fourth output of the fifth logic block forming the second output of the reconfigurable module, where this second output is able to be connected to the second input of a second reconfigurable module as claimed in the present claim.

5. The reconfigurable module of claim 4, further comprising a FIFO stack and a seventh logic block, the second output of the fifth logic block being connected to a first input of the seventh logic block, an output of the seventh logic block being connected to the second input of the operational block, the first output of the operational block being connected to an input of the FIFO stack, an output of the FIFO stack being connected to a second input of the seventh logic block and to a fifth input of the sixth logic block.

6. The reconfigurable module of claim 4, further comprising an eighth, a ninth and a tenth logic block, the first and third outputs of the fifth logic block being respectively connected to a first input of the eighth logic block and to a first input of the ninth logic block, the third output of the operational block being connected to a second input of the eighth logic block, to a second input of the ninth logic block and to the third input of the operational block, the second and third outputs of the operational block being respectively connected to a first and to a second input of the tenth logic block, an output of the tenth logic block being connected to the fifth input of the operational block.

7. The reconfigurable module of claim 1, further comprising a data register and an eleventh logic block, the third output of the operational block and the data register being respectively connected to a first and to a second input of the eleventh logic block, an output of the eleventh logic block being connected to the third input of the operational block.

8. A method of using the reconfigurable module of claim 1, said method comprising a step of determining, using adders/subtracters and logic blocks belonging to the operational block, starting from an original image comprising M rows and N columns of pixels p(m,n), M and N being positive integers, either an integral image,
or an eroded image,
or an expanded image,
or a Manhattan distance image,
or a projection along the rows and a projection along the columns of the original image,
configuring a type of operation of the adders/subtracters belonging to the operational block and of links established between inputs and outputs of the logic blocks belonging to the operational block, the integral image, the eroded image, the expanded image and the Manhattan distance image having same dimensions as the original image.

9. The method of claim 8 using the reconfigurable module, wherein a weighting wo(m,n) is associated with each pixel p(m,n) of the original image, the determination of the projections along the rows and along the columns of the original image comprising the following steps:

define a projection row comprising the same number N of columns as the rows of the original image and a projection column comprising the same number M of rows as the columns of the original image, a weighting wp(X,n) and wp(m,Y) being associated with each pixel p(X,n) of the projection row and with each pixel p(m,Y) of the projection column, respectively, iterate the following steps for m varying from 1 to M:
iterate the following steps for n varying from 1 to N:

add the weightings wp(m,Y) of the pixels p(m,Y) of the projection column to the weightings wo(m,n) of the pixels p(m,n) of the original image, and
add the weightings wp(X,n) of the pixels p(X,n) of the projection row to the weightings wo(m,n) of the pixels p(m,n) of the original image.

10. The method of claim 8 using the reconfigurable module, wherein a weighting wo(m,n) is associated with each pixel p(m,n) of the original image and a weighting wi(m,n) is associated with each pixel p(m,n) of the integral image, the determination of the integral image comprising the following steps:
  define an intermediate image of same dimensions as the original image, a weighting wii(m,n) being associated with each pixel p(m,n) of the intermediate image,
  initialize the weightings wii(1,n) of the pixels p(1,n) of the first row of the intermediate image,
  iterate the following steps for n varying from 2 to N:
    iterate the following steps for m varying from 2 to M, the weighting wo(m,n) being injected into the first input of the reconfigurable module, the fifth and eighth logic blocks connecting the first input of the reconfigurable module to the first input of the operational block, the operational block carrying out an addition of the weightings wo(m,n) and wii(m−1,n), the sixth logic block connecting the first output of the operational block to the first output of the reconfigurable module, the seventh logic block connecting the output of the FIFO stack to the second input of the operational block:
      add the weightings wo(m,n) of the pixels p(m,n) of the original image to the weightings wii(m−1,n) of the pixels p(m−1,n) of the intermediate image,
      store the results of the additions in the FIFO stack, the FIFO stack being of size M−1,
  initialize the weightings wi(m,1) of the pixels p(m,1) of the first column of the integral image,
  iterate the following steps for m varying from 2 to M:
    iterate the following steps for n varying from 2 to N, the weighting wii(m,n) being injected into the first input of the reconfigurable module, the fifth and eighth logic blocks connecting the first input of the reconfigurable module to the first input of the operational block, the operational block performing the addition of the weightings wii(m,n) and wi(m,n−1), the sixth logic block connecting the first output of the operational block to the first output of the reconfigurable module, the seventh logic block connecting the output of the FIFO stack to the second input of the operational block:
      add the weightings wii(m,n) of the pixels p(m,n) of the intermediate image to the weightings wi(m,n−1) of the pixels p(m,n−1) of the integral image, and
      store the results of the additions in the FIFO stack, the FIFO stack being of size N−1.

11. The method of claim 8 using the reconfigurable module, wherein a weighting wo(m,n) is associated with each pixel p(m,n) of the original image and a weighting wd(m,n) is associated with each pixel p(m,n) of the distance image, where the weighting wo(m,n) is able to take two values, a first value indicating that the pixel p(m,n) in question belongs to an object, a second value indicating that said pixel p(m,n) does not belong to the object, the determination of the distance image comprising the following steps:
  define an intermediate image of same dimensions as the original image, a weighting wid(m,n) being associated with each pixel p(m,n) of the intermediate image,
  define a first structural element composed of three pixels, a central pixel p(m,n), a pixel p(m,n−1) situated on the same row as the central pixel p(m,n) in the preceding column and a pixel p(m−1,n) situated on the same column as the central pixel p(m,n) in the preceding row,
  iterate the following steps for m varying from 1 to M:
    iterate the following steps for n varying from 1 to N, the seventh logic block connecting the output of the FIFO stack to the second input of the operational block, the eighth logic block connecting the third output to the first input of the operational block:
      determine whether the central pixel p(m,n) belongs to the object,
        if such is the case, assign the value zero to the weighting wid(m,n), the sixth logic block connecting the first input of the reconfigurable module to the first output of the reconfigurable module,
        otherwise, assign to the weighting wid(m,n) the minimum of the weightings wid(m,n−1) and wid(m−1,n) incremented by one unit, the sixth logic block connecting the third output of the operational block to the first output of the reconfigurable module,
  define a second structural element composed of three pixels, a central pixel p(m,n), a pixel p(m+1,n) situated on the same column as the central pixel p(m,n) in the following row and a pixel p(m,n+1) situated on the same row as the central pixel in the following column,
  iterate the following steps for m varying from M to 1:
    iterate the following steps for n varying from N to 1, the fifth and ninth logic blocks connecting the first input of the reconfigurable module to the fourth input of the operational block, the sixth logic block connecting the second output of the operational block to the first output of the reconfigurable module, the seventh logic block connecting the output of the FIFO stack to the second input of the operational block, the eighth logic block connecting the third output to the first input of the operational block:
      assign to the weighting wd(m,n) of the central pixel p(m,n) the minimum of the weightings wid(m,n), wd(m+1,n)+1 and wd(m,n+1)+1.

12. The method of claim 11 using the reconfigurable module, wherein the assignment to the weighting wid(m,n) of the minimum of the weightings wid(m,n−1) and wid(m−1,n) incremented by one unit comprises the following steps:
  subtract the second input from the first input of the first adder/subtracter,
  establish a link between the first or the second input and the output of the first logic block depending on the sign of the result of the subtraction,
  establish a link between the second input and the first output and between the first input and the second output of the fourth logic block, and
  add the value "one" to the first input of the third adder/subtracter, the eleventh logic block connecting the data register to the third input of the operational block.

13. The method of claim 11 using the reconfigurable module, wherein the assignment to the weighting wd(m,n) of the minimum of the weightings wid(m,n), wd(m+1,n)+1 and wd(m,n+1)+1 comprises the following steps:
  subtract the second input from the first input of the first adder/subtracter,
  establish a link between the first or the second input and the output of the first logic block depending on the sign of the result of the subtraction, establish a link between the second input and the first output and between the first input and the second output of the fourth logic block, add the value "one" to the first input of the third adder/subtracter, the eleventh logic block connecting the data register to the third input of the operational block, establish a link between the output of the third adder/subtracter and the second input of the second adder/subtracter via the third logic block, subtract the second input from the first input of the second adder/subtracter, and establish a link between the first or the second input and the output of the second logic block depending on the sign of the result of the subtraction.

14. The method of claim 8 using the reconfigurable module, wherein a weighting wo(m,n) is associated with each pixel p(m,n) of the original image and a weighting wf(m,n) is associated with each pixel p(m,n) of the expanded image, the determination of the expanded image by a structural element with dimensions 3×3 comprising the following steps:

decompose the structural element into a first sub-structural element of dimension 1×3 and into a second sub-structural element of dimension 3×1, define an intermediate image of same dimensions as the original image, a weighting wif(m,n) being associated with each pixel p(m,n) of the intermediate image, iterate the following steps for m varying from 1 to M:
iterate the following steps for n varying from 1 to N:
assign to the weighting wif(m,n) the maximum of the weightings wo(x,y) of the pixels p(x,y) belonging to the first sub-structural element centered on the pixel p(m,n) in question, iterate the following steps for n varying from 1 to N:
iterate the following steps for m varying from 1 to M:
assign to the weighting wf(m,n) the maximum of the weightings wif(x,y) of the pixels p(x,y) belonging to the second sub-structural element centered on the pixel p(m,n) in question, wherein the weightings wo(x,y) or wie(x,y) are injected into the first input of the reconfigurable module, the fifth logic block successively connecting the first input of the reconfigurable module to the first input of the operational block via the eighth logic block, to the second input of the operational block via the seventh logic block, and to the fourth input of the operational block via the ninth logic block, the tenth logic block connecting the third output to the fifth input of the operational block, the operational block determining the maximum of the weightings wo(x,y) or wif(x,y) of the pixels p(x,y) belonging to the first or to the second sub-structural element centered on the pixel p(m,n), the sixth logic block connecting the second output of the operational block to the first output of the reconfigurable module.

15. The method of claim 14 using the reconfigurable module, wherein the assignment to the weighting wif(m,n) or wf(m,n) of the maximum of the weightings wo(x,y) or wif(x,y) of the pixels p(x,y) belonging to the first or to the second sub-structural element comprises the following steps:

subtract the second input from the first input of the first adder/subtracter, establish a link between the first or the second input and the output of the first logic block depending on the sign of the result of the subtraction, establish a link between the second input and the first output of the fourth logic block, add or subtract the first input of the third adder/subtracter to or from the value zero, establish a link between the first input and the output of the third logic block, subtract the second input from the first input of the second adder/subtracter, and establish a link between the first or the second input and the output of the second logic block depending on the sign of the result of the second subtraction.

16. The method of claim 8 using the reconfigurable module, wherein a weighting wo(m,n) is associated with each pixel p(m,n) of the original image and a weighting we(m,n) is associated with each pixel p(m,n) of the eroded image, the determination of the eroded image by a structural element with dimensions 3×3 comprising the following steps:

decompose the structural element into a first sub-structural element with dimensions 1×3 and into a second sub-structural element with dimensions 3×1, define an intermediate image of same dimensions as the original image, a weighting wie(m,n) being associated with each pixel p(m,n) of the intermediate image, iterate the following steps for m varying from 1 to M:
iterate the following steps for n varying from 1 to N:
assign to the weighting wie(m,n) the minimum of the weightings wo(x,y) of the pixels p(x,y) belonging to the first sub-structural element centered on the pixel p(m,n) in question, iterate the following steps for n varying from 1 to N:
iterate the following steps for m varying from 1 to M:
assign to the weighting we(m,n) the minimum of the weightings wie(x,y) of the pixels p(x,y) belonging to the second sub-structural element centered on the pixel p(m,n) in question, wherein the weightings wo(x,y) or wie(x,y) are injected into the first input of the reconfigurable module, the fifth logic block successively connecting the first input of the reconfigurable module to the first input of the operational block via the eighth logic block, to the second input of the operational block via the seventh logic block, and to the fourth input of the operational block via the ninth logic block, the tenth logic block connecting the third output to the fifth input of the operational block, the operational block determining the minimum of the weightings wo(x,y) or wie(x,y) of the pixels p(x,y) belonging to the first or to the second sub-structural element centered on the pixel p(m,n), the sixth logic block connecting the second output of the operational block to the first output of the reconfigurable module.

17. The method of claim 16 using the reconfigurable module, wherein the assignment to the weightings wie(m,n) or we(m,n) of the minimum of the weightings wo(x,y) or wie(x,y) of the pixels p(x,y) belonging to the first or to the second sub-structural element comprises the following steps:

subtract the second input from the first input of the first adder/subtracter, establish a link between the first or the second input and the output of the first logic block depending on the sign of the result of the subtraction, establish a link between the second input and the first output of the fourth logic block, add or subtract the first input of the third adder/subtracter to or from the value zero, establish a link between the first input and the output of the third logic block, subtract the second input from the first input of the second adder/subtracter, and establish a link between the first or the second input and the output of the second logic block depending on the sign of the result of the second subtraction.

* * * * *